(12) United States Patent
Liao

(10) Patent No.: US 9,793,370 B2
(45) Date of Patent: Oct. 17, 2017

(54) TRANSISTOR WITH OXIDIZED CAP LAYER

(71) Applicant: DELTA ELECTRONICS, INC., Taoyuan (TW)

(72) Inventor: Wen-Chia Liao, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 14/721,796

(22) Filed: May 26, 2015

(65) Prior Publication Data

US 2015/0349107 A1 Dec. 3, 2015

Related U.S. Application Data

(60) Provisional application No. 62/005,294, filed on May 30, 2014.

(51) Int. Cl.
| H01L 29/778 | (2006.01) |
| H01L 29/205 | (2006.01) |
| H01L 29/51 | (2006.01) |
| H01L 21/311 | (2006.01) |
| H01L 29/66 | (2006.01) |
| H01L 21/02 | (2006.01) |
| H01L 21/28 | (2006.01) |
| H01L 29/20 | (2006.01) |

(Continued)

(52) U.S. Cl.
CPC .. *H01L 29/66462* (2013.01); *H01L 21/02241* (2013.01); *H01L 21/02252* (2013.01); *H01L 21/02255* (2013.01); *H01L 21/28264* (2013.01); *H01L 21/31105* (2013.01); *H01L 29/2003* (2013.01); *H01L 29/205* (2013.01); *H01L 29/4236* (2013.01); *H01L 29/513* (2013.01); *H01L 29/518* (2013.01); *H01L 29/7786* (2013.01); *H01L 29/7787* (2013.01)

(58) Field of Classification Search
CPC .................. H01L 29/66462; H01L 29/778
See application file for complete search history.

(56) References Cited

U.S. PATENT DOCUMENTS

| 7,361,938 B2 | 4/2008 | Mueller et al. |
| 7,709,859 B2 | 5/2010 | Smith et al. |

(Continued)

FOREIGN PATENT DOCUMENTS

| CN | 103137476 | 6/2013 |
| TW | I375326 | 10/2012 |

(Continued)

OTHER PUBLICATIONS

Taking, S., et al. "Surface passivation of Ain/GaN MOS-HEMTs using ultra-thin Al 2 O 3 formed by thermal oxidation of evaporated aluminium." Electronics letters 46.4 (2010): 301-302.*

(Continued)

*Primary Examiner* — Victor A Mandala
*Assistant Examiner* — Regan J Rundio
(74) *Attorney, Agent, or Firm* — Hauptman Ham, LLP

(57) ABSTRACT

A semiconductor device includes a substrate, a channel layer, a spacer layer, a barrier layer, and an oxidized cap layer. The channel layer is disposed on or above the substrate. The spacer layer is disposed on the channel layer. The barrier layer is disposed on the spacer layer. The oxidized cap layer is disposed on the barrier layer. The oxidized cap layer is made of oxynitride.

6 Claims, 7 Drawing Sheets

(51) Int. Cl.
*H01L 29/423* (2006.01)
*H01L 21/283* (2006.01)
*H01L 21/20* (2006.01)
*H01L 21/336* (2006.01)

(56) References Cited

U.S. PATENT DOCUMENTS

| | | | |
|---|---|---|---|
| 7,795,642 B2 | 9/2010 | Suh et al. | |
| 8,309,987 B2* | 11/2012 | Derluyn | H01L 29/2003 257/192 |
| 8,384,129 B2 | 2/2013 | Kub et al. | |
| 2013/0083568 A1 | 4/2013 | Makiyama et al. | |
| 2013/0102140 A1* | 4/2013 | Derluyn | H01L 29/2003 438/586 |
| 2013/0105810 A1* | 5/2013 | Nishimori | H03F 3/189 257/76 |
| 2013/0140605 A1 | 6/2013 | Ramdani et al. | |
| 2013/0292698 A1* | 11/2013 | Then | H01L 29/4236 257/76 |
| 2013/0313609 A1* | 11/2013 | Akutsu | H01L 29/78 257/192 |
| 2013/0320349 A1* | 12/2013 | Saunier | H01L 29/66462 257/76 |
| 2014/0011349 A1* | 1/2014 | Okazaki | H01L 29/66477 438/585 |
| 2014/0183598 A1* | 7/2014 | Chiu | H01L 29/42364 257/190 |
| 2014/0185347 A1 | 7/2014 | Makiyama et al. | |
| 2015/0041821 A1* | 2/2015 | Nakayama | H01L 29/66462 257/76 |
| 2015/0053921 A1* | 2/2015 | Cheng | H01L 21/28264 257/20 |
| 2015/0144955 A1* | 5/2015 | Cheng | H01L 29/402 257/76 |
| 2015/0279982 A1* | 10/2015 | Yamamoto | H01L 29/42316 257/76 |
| 2017/0025515 A1* | 1/2017 | Oka | H01L 29/513 |

FOREIGN PATENT DOCUMENTS

| | | |
|---|---|---|
| TW | 201330260 | 7/2013 |
| TW | 201349491 | 12/2013 |

OTHER PUBLICATIONS

Junichi Kashiwagi, et.al., "Recessed-Gate Enhancement-Mode GaN MOSFETs With a Double-Insulator Gate Providing 10-MHz Switching Operation", IEEE Electron Device Letters, p. 1109-1111,vol. 34, No. 9, Sep. 2013.

Medjdoub, Farid, et al. , "Novel E-Mode GaN-on-Si MOSHEMT Using a Selective Thermal Oxidation", IEEE Electron Device Letters 31.9 (2010): 948-950.

Kalavagunta et al., "Electrostatic Mechanisms Responsible for Device Degradation in Proton Irradiated AlGaN /AlN / GaN HEMTs", IEEE Transactions on Nuclear Science, 55.4 (2008): 2106-2112.

* cited by examiner

TRANSISTOR WITH OXIDIZED CAP LAYER

CROSS-REFERENCE TO RELATED APPLICATIONS

This application claims the priority benefit of U.S. Provisional Application Ser. No. 62/005,294, filed May 30, 2014, the full disclosures of which are incorporated herein by reference.

BACKGROUND

Field of Invention

The present invention relates to a semiconductor device.

Description of Related Art

In recently, the technologies of Si-based semiconductor are developed and have been mature. However, as the sizes of the semiconductor devices become smaller, it brings out some bottlenecks about the device characteristics come from the semiconductor material thereof. Many new technologies of other semiconductor device to replace Si-based semiconductor are therefore presented. The III-V group semiconductor, especially the nitride-based semiconductor material, gallium nitride for example, possesses special spontaneous polarization, high electron saturation velocity, and high breakdown electric field. Since the generation of two dimensional electron gas (2DEG) is caused by spontaneous polarization and piezoelectric polarization, the nitride-based semiconductor is received more attentions in the art.

SUMMARY

An aspect of the present invention is to provide a semiconductor device including a substrate, a channel layer, a spacer layer, a barrier layer, and an oxidized cap layer. The channel layer is disposed on or above the substrate. The spacer layer is disposed on the channel layer. The barrier layer is disposed on the spacer layer. The oxidized cap layer is disposed on the barrier layer. The oxidized cap layer is made of oxynitride.

In one or more embodiments, a thickness of the spacer layer is less than 5 nm.

In one or more embodiments, the spacer layer is made of aluminum nitride.

In one or more embodiments, a thickness of the cap layer is less than 5 nm.

In one or more embodiments, the oxidized cap layer is made of aluminum oxynitride.

In one or more embodiments, the barrier layer is made of aluminum gallium nitride ($Al_xGa_{(1-x)}N$), and $0.1 \leq x \leq 0.4$.

The semiconductor device further includes a source electrode, a drain electrode, and a gate electrode. The source electrode and the drain electrode are separately disposed on or above the barrier layer. The gate electrode is disposed at least on or above the oxidized cap layer and is disposed between the source electrode and the drain electrode.

In one or more embodiments, the semiconductor device further includes a passivation layer disposed on the oxidized cap layer, and at least a portion of the passivation layer disposed between the oxidized cap layer and the gate electrode.

In one or more embodiments, the spacer layer has an oxidation segment. The oxidized cap layer has a first recess, and the barrier layer has a second recess. The first recess and the second recess together expose at least a portion of the oxidation segment. At least a portion of the gate electrode is disposed in the first recess and the second recess.

In one or more embodiments, the semiconductor device further includes a passivation layer conformally disposed in the first recess and the second recess. At least a portion of the passivation layer disposed between the gate electrode and the oxidation segment of the spacer layer.

Another aspect of the present invention is to provide a method for manufacturing a semiconductor device including the following acts. A channel layer is formed on or above a substrate. A spacer layer is formed on the channel layer. A barrier layer is formed on the spacer layer. A cap layer is formed on the barrier layer. The cap layer is oxidizing to form an oxidized cap layer on the barrier layer. The oxidized cap layer is made of oxynitride.

In one or more embodiments, the spacer layer is made of aluminum nitride.

In one or more embodiments, the oxidized cap layer is made of aluminum oxynitride.

In one or more embodiments, the barrier layer is made of aluminum gallium nitride ($Al_xGa_{(1-x)}N$), and $0.1 \leq x \leq 0.4$.

In one or more embodiments, the cap layer is oxidized using a high-temperature oxidizing process, and the temperature is higher than 700° C.

In one or more embodiments, the method further includes the following acts. A source electrode and a drain electrode are formed on or above the barrier layer. A gate electrode is formed at least on or above the oxidized cap layer and between the source electrode and the drain electrode.

In one or more embodiments, the method further includes the following act. A passivation layer is formed on the oxidized cap layer and forming at least a portion of the passivation layer between the oxidized cap layer and the gate electrode.

In one or more embodiments, the method further includes the following acts. A first recess is formed in the cap layer to expose a portion of the barrier layer. A second recess is formed in the barrier layer through the second recess to expose a portion of the spacer layer.

In one or more embodiments, the act of oxidizing the cap layer includes the following act. The cap layer and the portion of the spacer layer are oxidized together to form the oxidized cap layer and an oxidation segment in the spacer layer. The act of forming the gate electrode includes the following act. The gate electrode is further formed in the first recess and the second recess.

In one or more embodiments, the method further includes the following act. A passivation layer is conformally formed in the first recess and the second recess, such that at least a portion of the passivation layer is disposed between the gate electrode and the oxidation segment of the spacer layer.

Another aspect of the present invention is to provide a method for manufacturing a semiconductor device including the following acts. A channel layer is formed on or above a substrate. A spacer layer is formed on the channel layer. A barrier layer is formed on the spacer layer. A cap layer is formed on the barrier layer. A first recess is formed in the cap layer by etching the cap layer. A second recess is formed in the barrier layer by etching the barrier layer to expose a portion of the spacer layer. The cap layer and the exposed spacer layer are oxidized to form an oxidized cap layer and an oxidation segment. The oxidized cap layer is made of oxynitride.

In one or more embodiments, the spacer layer is made of aluminum nitride.

In one or more embodiments, the oxidized cap layer is made of aluminum oxynitride.

In one or more embodiments, the barrier layer is made of aluminum gallium nitride ($Al_xGa_{(1-x)}N$), and $0.1 \leq x \leq 0.4$.

In one or more embodiments, the cap layer is oxidized using a high-temperature oxidizing process, and the temperature is higher than 700° C.

DETAILED DESCRIPTION

Figure 1A:
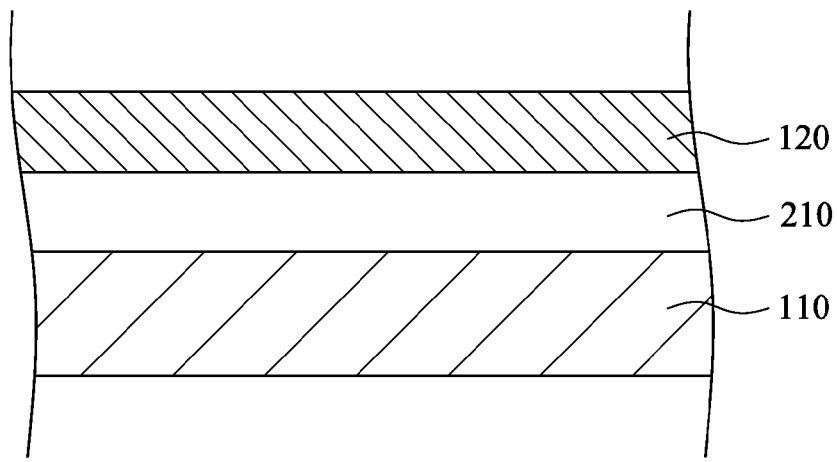
FIG. 1A to FIG. 1E are cross-sectional views of a method for manufacturing a semiconductor device at different stages according to the first embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1A to FIG. 1E are cross-sectional views of a method for manufacturing a semiconductor device at different stages according to the first embodiment of the present invention. As shown in FIG. 1A, a substrate 110 is provided first. Subsequently, a buffer layer 210 is optionally formed on the substrate 110. In this embodiment, the substrate 110 can be made of sapphire, Si, or SiC, and the buffer layer 210 can be made of AlN or other suitable materials. Then, a channel layer 120 is formed on or above the substrate 110. For example, in FIG. 1A, the channel layer 120 is formed above the substrate 110 and on the buffer layer 210. In this embodiment, the channel layer 120 can be made of GaN, and the act of forming the channel layer 120 can be performed by chemical vapor deposition (CVD).

Figure 1B:
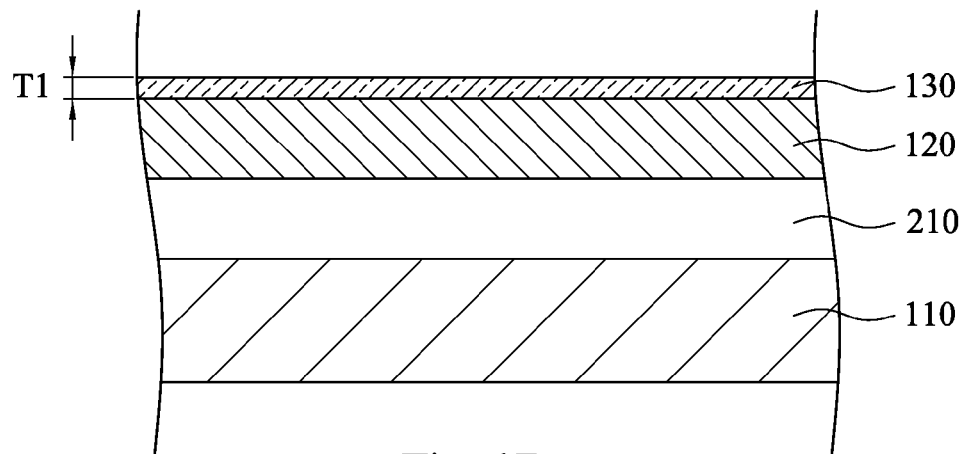
Figure 1C:
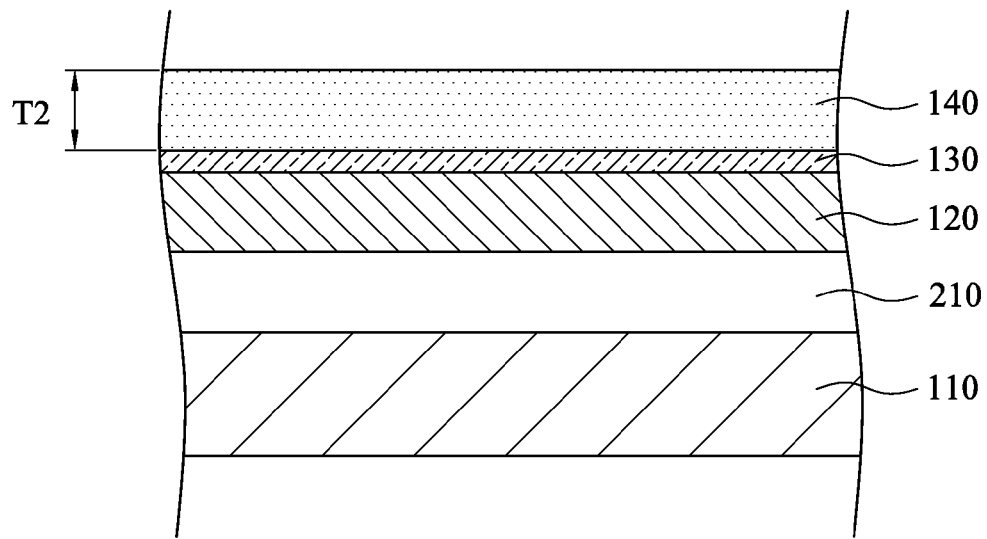

Reference is made to FIG. 1B. A spacer layer 130 is formed on the channel layer 120. In this embodiment, the spacer layer 130 can be made of aluminum nitride (AlN), the thickness T1 of the spacer layer 130 can be less than 5 nm, and the act of forming the spacer layer 130 can be performed by metal organic chemical vapor deposition (MOCVD).

Reference is made to FIG. 10. Subsequently, a barrier layer 140 is formed on the spacer layer 130. In this embodiment, the barrier layer 140 can be made of aluminum gallium nitride ($Al_xGa_{(1-x)}N$), and $0.1 \leq x \leq 0.4$. The thickness T2 of the barrier layer 140 can be less than 40 nm, and the act of forming the barrier layer 140 can be performed by metal organic chemical vapor deposition (MOCVD).

Figure 1D:
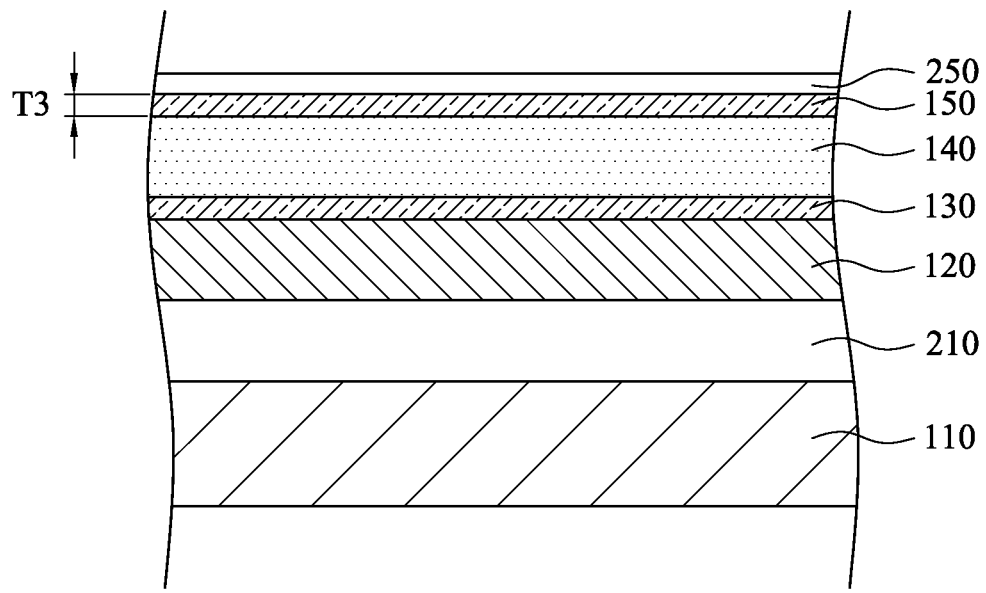

Reference is made to FIG. 1D. A cap layer 150 is formed on the barrier layer 140. In this embodiment, the cap layer 150 can be made of aluminum nitride (AlN), the thickness T3 of the cap layer 150 can be less than 5 nm, and the act of forming the cap layer 150 can be performed by metal organic chemical vapor deposition (MOCVD). Furthermore, the metal organic chemical vapor deposition process can be a high-temperature growth process to reduce the defect of the cap layer 150, and the performance of the cap layer 150 can be improved.

Subsequently, a sacrificial layer 250 is formed on the cap layer 150. In this embodiment, the sacrificial layer 250 can be made of gallium nitride (GaN). The act of forming the sacrificial layer 250 can be performed by metal organic chemical vapor deposition (CVD). The sacrificial layer 250 is configured to prevent native oxidization. In some other embodiments, the sacrificial layer 250 can be omitted.

Figure 1E:
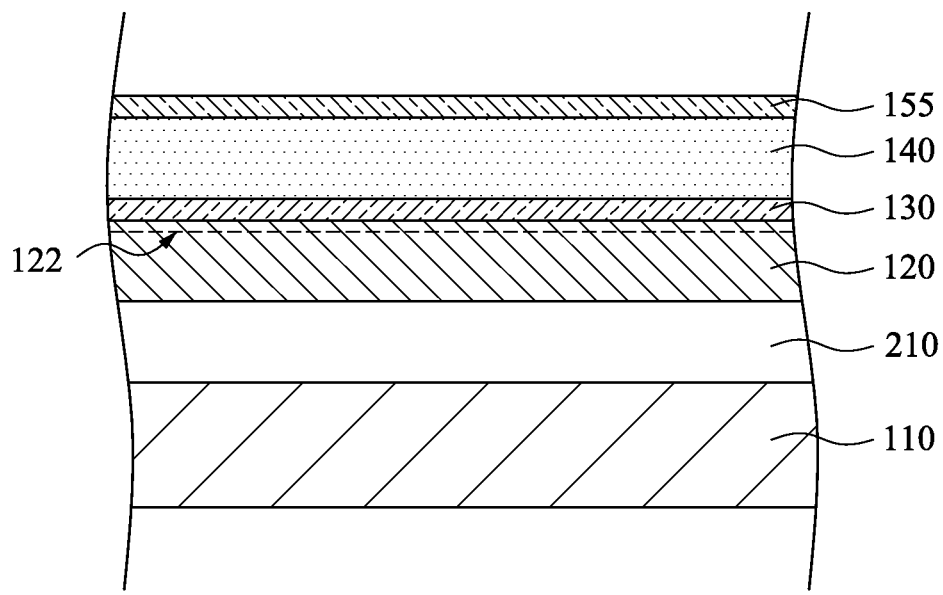

Reference is made to FIG. 1E. Then, the cap layer 150 is oxidized (see FIG. 1D) to form an oxidized cap layer 155 on the barrier layer 140, and the sacrificial layer 250 (see FIG. 1D) is also oxidized to form an oxidized sacrificial layer (not shown). In this embodiment, the oxidized cap layer 155 can be made of aluminum oxynitride (AlON), and the act of oxidizing the cap layer 150 can be performed by high-temperature oxidizing process, such as high-temperature oxygen in furnace process or rapid thermal annealing (RTA) process, and the temperature is higher than 700° C. In some other embodiments, the act of oxidizing the cap layer 150 can be performed by oxygen-based plasma process or chemical solutions (such as hydrogen peroxide ($H_2O_2$)). The oxidized sacrificial layer can be removed by dipping the structure in dilute HCl.

From a structural point of view, the semiconductor device includes the substrate 110, the channel layer 120, the spacer layer 130, the barrier layer 140, and the oxidized cap layer 155. The channel layer 120 is disposed above the substrate 110. The spacer layer 130 is disposed on the channel layer 120. The barrier layer 140 is disposed on the spacer layer 130. The oxidized cap layer 155 is disposed on the barrier layer 140. The oxidized cap layer 155 is made of oxynitride, such as aluminum oxynitride (AlON). A two-dimensional electron gas (2DEG) channel 122 exists in the channel layer 120 and near the spacer layer 130. In one or more embodiments, the semiconductor device can further include the buffer layer 210 disposed between the substrate 110 and the channel layer 120. Since the cap layer 150 is performed by high-temperature growth process, the quality of the interface of the cap layer 150 and the structure formed thereon can be improved.

Figure 2A:
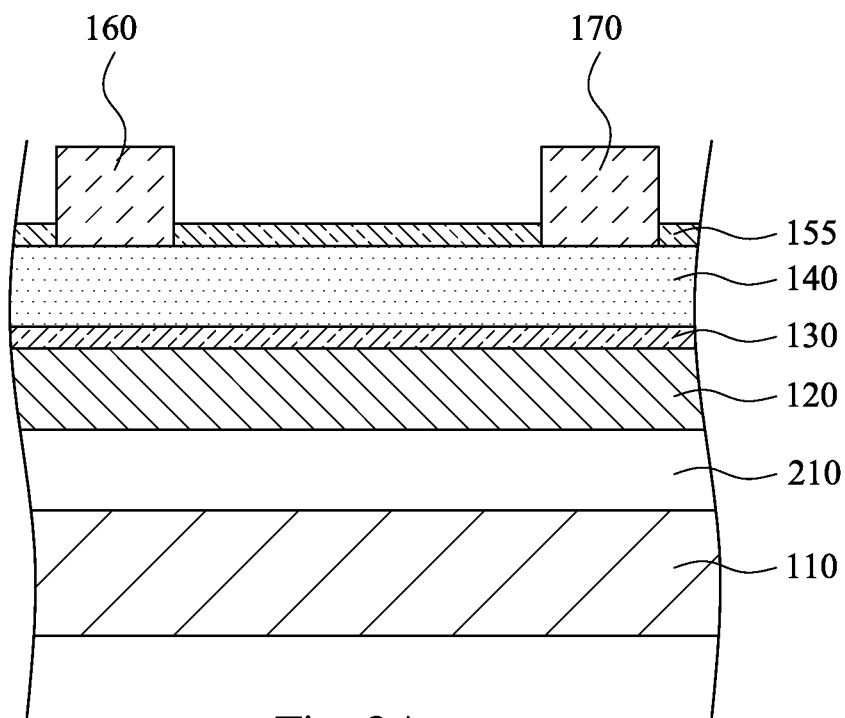
FIG. 2A to FIG. 2B are cross-sectional views of a method for manufacturing a semiconductor device at different stages according to the second embodiment of the present invention.
Figure 2B:
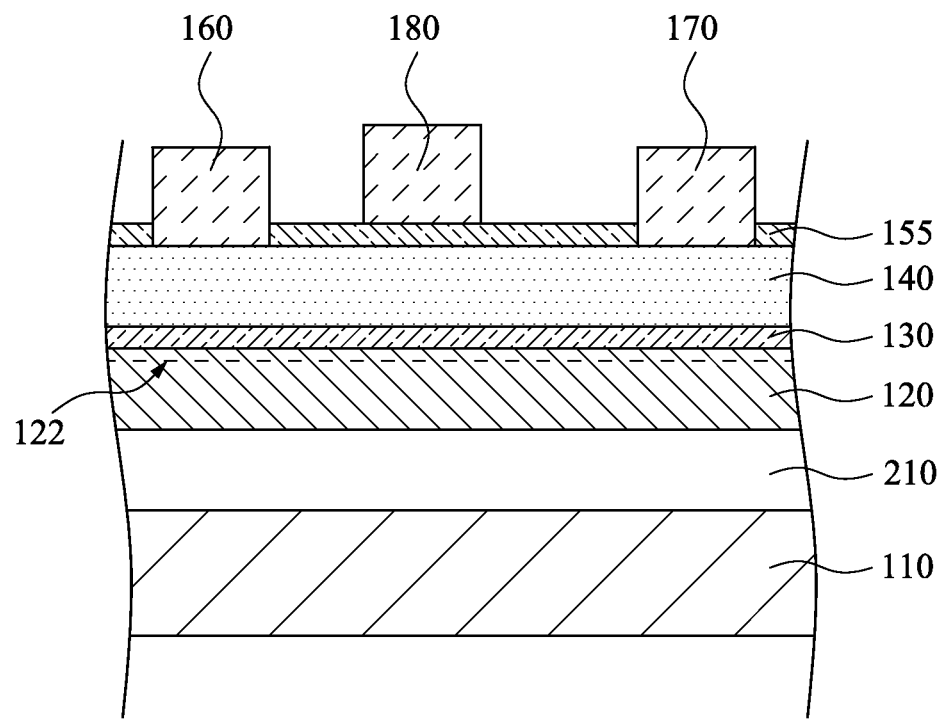

FIG. 2A to FIG. 2B are cross-sectional views of a method for manufacturing a semiconductor device at different stages according to the second embodiment of the present invention. The difference between the second embodiment and the first embodiment pertains to a source electrode 160, a drain electrode 170, and a gate electrode 180. Reference is made to FIG. 2A. The manufacturing processes of FIG. 1A to FIG. 1E can be performed first. Since the relevant manufacturing details are all the same as the first embodiment, and, therefore, a description in this regard will not be repeated hereinafter. Subsequently, a source electrode 160 and a drain electrode 170 are formed on the barrier layer 140. For example, a first conductive layer is formed to cover the oxidized cap layer 155 and the exposed barrier layer 140. Subsequently, the first conductive layer is patterned to form the source electrode 160 and the drain electrode 170. In one or more embodiments, an annealing process can be performed after forming the source electrode 160 and the drain electrode 170.

In this embodiment, the source electrode 160 and the drain electrode 170 can be made of titanium (Ti), aluminum (Al), nickel (Ni), gold (Au), or any combination thereof. The first conductive layer can be performed by physical vapor deposition process such as sputtering, or e-beam evaporation, and the first conductive layer can be patterned by lithography and etching process. The temperature of performing the annealing process can be about 800° C., and the claimed scope of the present invention is not limited in this respect.

Reference is made to FIG. 2B. A gate electrode 180 is formed on the oxidized cap layer 155 and between the source electrode 160 and the drain electrode 170. For example, a second conductive layer can be formed to cover at least the oxidized cap layer 155. Subsequently, the second conductive layer is patterned to form the gate electrode 180. The gate electrode 180 can be made of titanium (Ti), aluminum (Al), nickel (Ni), gold (Au), or any combination thereof. The second conductive layer can be performed by physical vapor deposition process such as sputtering, or e-beam evaporation process, and the second conductive layer can be patterned by lithography and etching process.

From a structural point of view, the difference between the second embodiment and the first embodiment pertains to the source electrode 160, the drain electrode 170, and the gate electrode 180. The source electrode 160 and the drain electrode 170 are separately disposed on the barrier layer 140. The gate electrode 180 is disposed at least on the oxidized cap layer 155 and is disposed between the source electrode 160 and the drain electrode 170.

A two-dimensional electron gas (2DEG) channel 122 exists in the channel layer 120 and near the spacer layer 130. The source electrode 160 can be electrically connected to the drain electrode 170 through the 2DEG channel 122. That is, the semiconductor device of this embodiment is a depletion-mode transistor. Other relevant structural details of the second embodiment are all the same as the first embodiment, and, therefore, a description in this regard will not be repeated hereinafter.

Figure 3A:
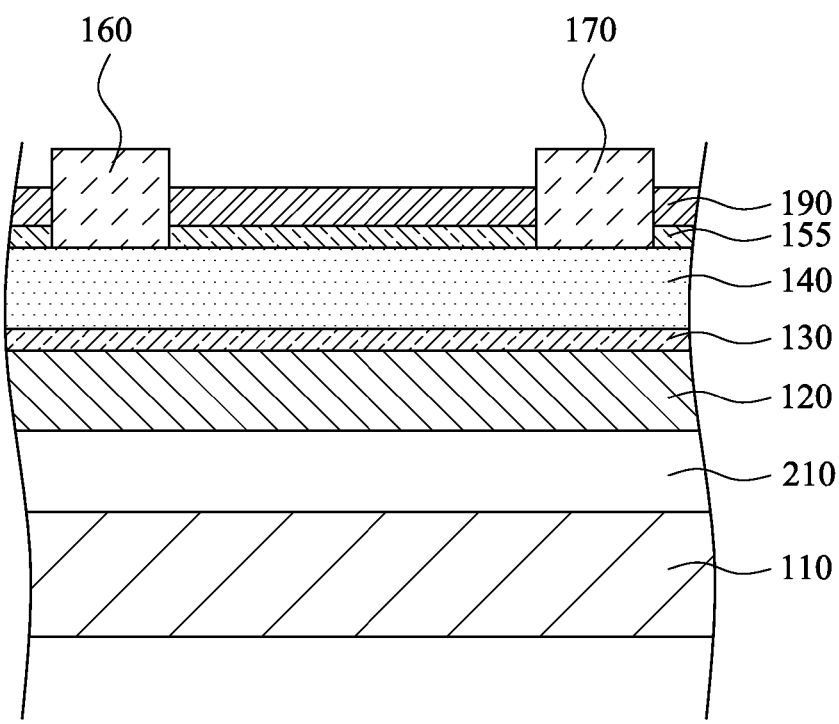
FIG. 3A to FIG. 3B are cross-sectional views of a method for manufacturing a semiconductor device at different stages according to the third embodiment of the present invention.
Figure 3B:
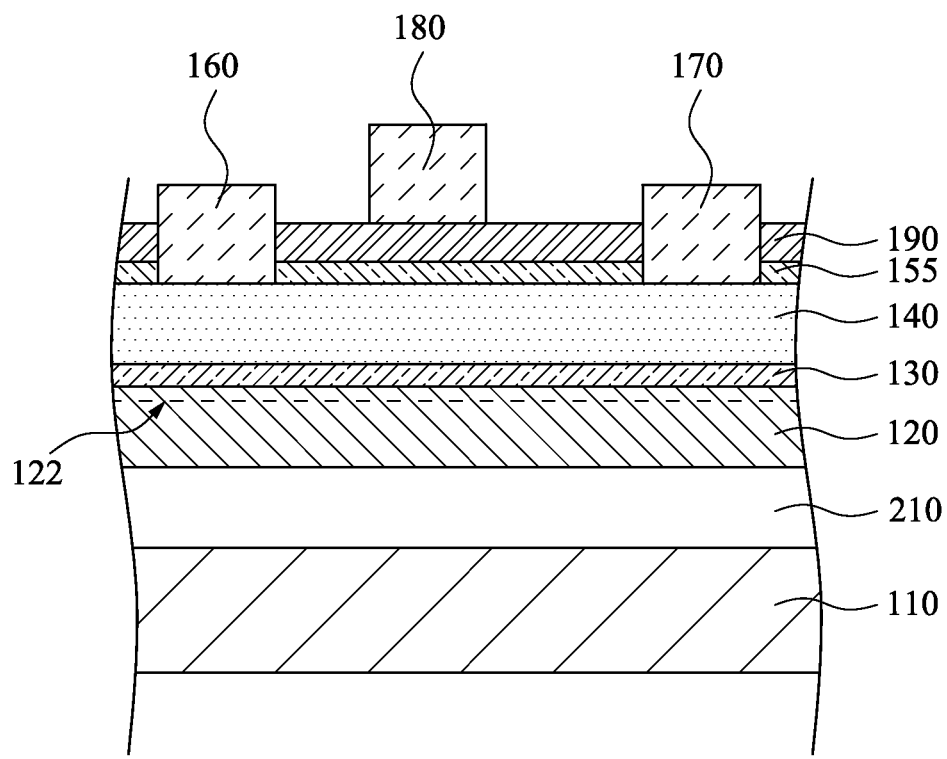

FIG. 3A to FIG. 3B are cross-sectional views of a method for manufacturing a semiconductor device at different stages according to the third embodiment of the present invention. The difference between the third embodiment and the second embodiment pertains to a passivation layer 190. Reference is made to FIG. 3A. The manufacturing processes of FIG. 1A to FIG. 1E, and FIG. 2A can be performed first. Since the relevant manufacturing details are all the same as the second embodiment, and, therefore, a description in this regard will not be repeated hereinafter. Subsequently, the passivation layer 190 is formed on the oxidized cap layer 155. In this embodiment, the passivation layer 190 can be made of aluminum oxide ($Al_2O_3$), aluminum nitride (AlN), silicon nitride ($Si_3N_4$), silicon oxide ($SiO_2$), hafnium oxide ($HfO_2$), or any combination thereof. The passivation layer 190 can be performed by chemical vapor deposition.

Reference is made to FIG. 3B. A gate electrode 180 is formed above the oxidized cap layer 155, on the passivation layer 190, and between the source electrode 160 and the drain electrode 170. For example, a second conductive layer is formed to cover at least the passivation layer 190. Subsequently, the second conductive layer is patterned to form the gate electrode 180. The gate electrode 180 can be made of titanium (Ti), aluminum (Al), nickel (Ni), gold (Au), or any combination thereof. The second conductive layer can be performed by physical vapor deposition process such as sputtering, or e-beam evaporation process, and the second conductive layer can be patterned by lithography and etching process.

From a structural point of view, the difference between the third embodiment and the second embodiment pertains to the passivation layer 190. In this embodiment, the passivation layer 190 is disposed on the oxidized cap layer 155, and at least a portion of the passivation layer 190 is disposed between the oxidized cap layer 155 and the gate electrode 180. The passivation layer 190 protects the underlying layers. Other relevant structural details of the third embodiment are all the same as the second embodiment, and, therefore, a description in this regard will not be repeated hereinafter.

Figure 4A:
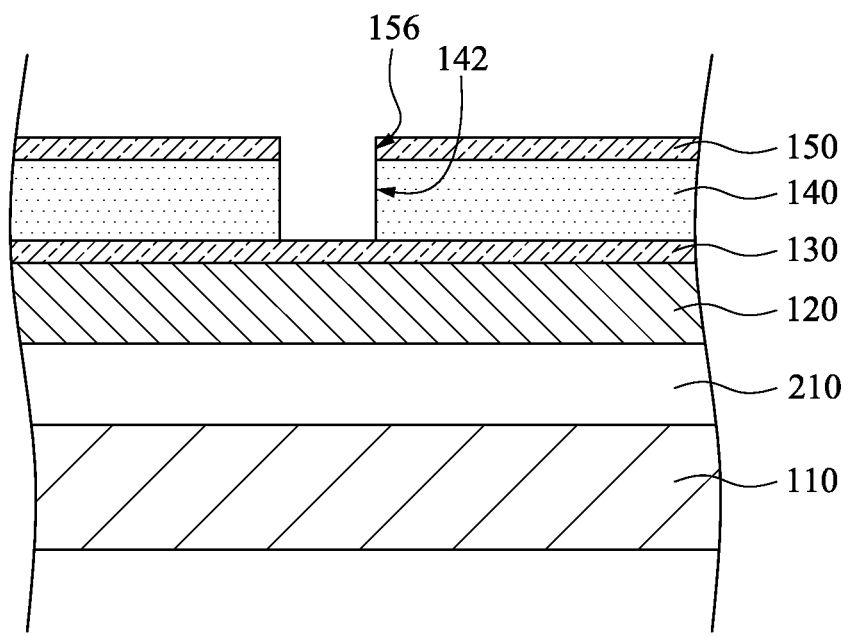
FIG. 4A to FIG. 4D are cross-sectional views of a method for manufacturing a semiconductor device at different stages according to the fourth embodiment of the present invention.

FIG. 4A to FIG. 4D are cross-sectional views of a method for manufacturing a semiconductor device at different stages according to the fourth embodiment of the present invention. The difference between the fourth embodiment and the first embodiment pertains to a source electrode 160, a drain electrode 170, a gate electrode 180, a first recess 156, and a second recess 142. Reference is made to FIG. 4A. The manufacturing processes of FIG. 1A to FIG. 1D are performed first. Since the relevant manufacturing details are all the same as the first embodiment, and, therefore, a description in this regard will not be repeated hereinafter. Subsequently, a first recess 156 is formed in the cap layer 150 to expose a portion of the barrier layer 140. The first recess 156 can be performed by lithography and etching process. In this embodiment, since the materials of the cap layer 150 (ex. AlN) and the barrier layer 140 (ex. $Al_xGa_{(1-x)}N$, and $0.1 \leq x \leq 0.4$) are different, the barrier layer 140 can be an etching stop layer during the cap layer 150 etching process.

Then, a second recess 142 is formed in the barrier layer 140 to expose a portion of the spacer layer 130. The second recess 142 can be performed by etching process using the cap layer 150 as a mask. In this embodiment, since the materials of the barrier layer 140 (ex. $Al_xGa_{(1-x)}N$, and $0.1 \leq x \leq 0.4$) and the spacer layer 130 (ex. AlN) are different, the spacer layer 130 can be an etching stop layer during the barrier layer 140 etching process. Therefore, the spacer layer 130 prevents the channel layer 120 from being etched, and the surface of the channel layer 120 avoids etching damages, leading to a good quality of 2DEG channel.

Figure 4B:
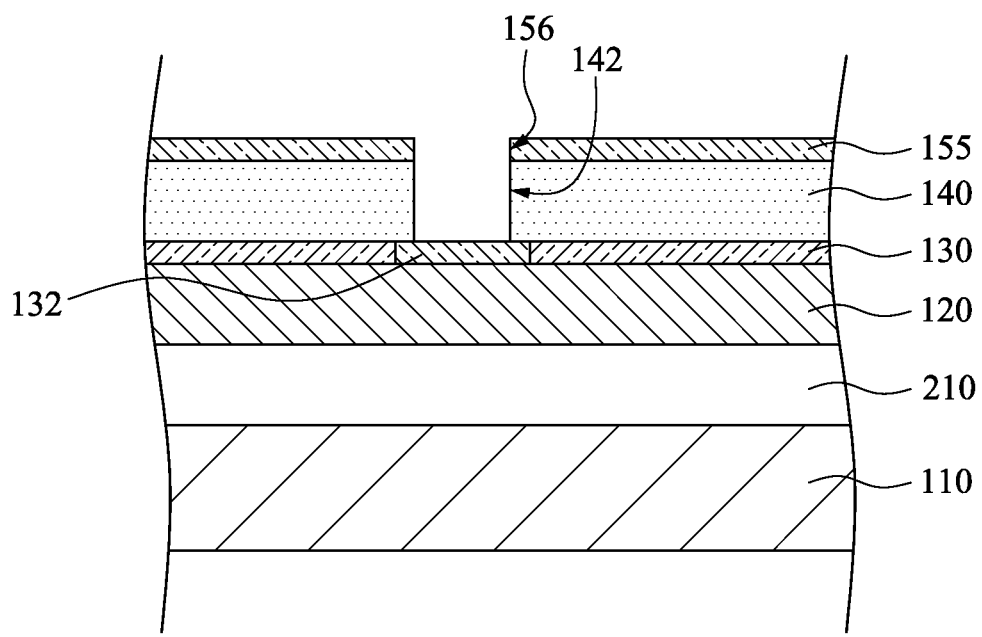

Reference is made to FIG. 4B. The cap layer 150 (see FIG. 4A) and the portion of the spacer layer 130 are oxidized together to form the oxidized cap layer 155 and an oxidation segment 132 in the spacer layer 130. In other words, the materials of the oxidized cap layer 155 and the oxidation segment 132 are both aluminum oxynitride (AlON). The act of oxidizing the cap layer 150 and the portion of the spacer layer 130 can be performed by high-temperature oxidizing process, such as high-temperature oxygen in furnace process or rapid thermal annealing (RTA) process, and the temperature is higher than 700° C. In some other embodiments, the act of oxidizing the cap layer 150 can be performed by oxygen-based plasma technique or chemical solutions (such as $H_2O_2$).

Figure 4C:
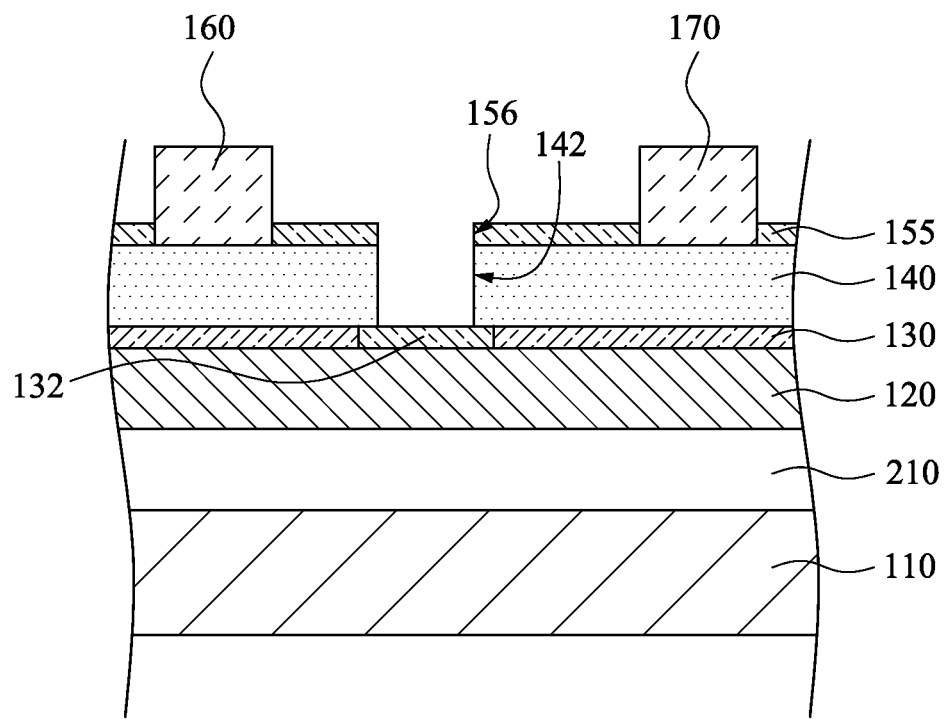

Reference is made to FIG. 4C. A source electrode 160 and a drain electrode 170 are formed on the barrier layer 140. In one or more embodiments, an annealing process can be performed after forming the source electrode 160 and the drain electrode 170 to form ohmic contacts between the source electrode 160 and the barrier layer 140, and between the drain electrode 170 and the barrier layer 140.

In this embodiment, the source electrode 160 and the drain electrode 170 can be made of titanium (Ti), aluminum (Al), nickel (Ni), gold (Au), or any combination thereof. The source electrode 160 and the drain electrode 170 can be performed by physical vapor deposition process such as sputtering, or e-beam evaporation process, and the source electrode 160 and the drain electrode 170 can be patterned by lithography process. The temperature of performing the annealing process can be about 800° C., and the claimed scope of the present invention is not limited in this respect.

Figure 4D:
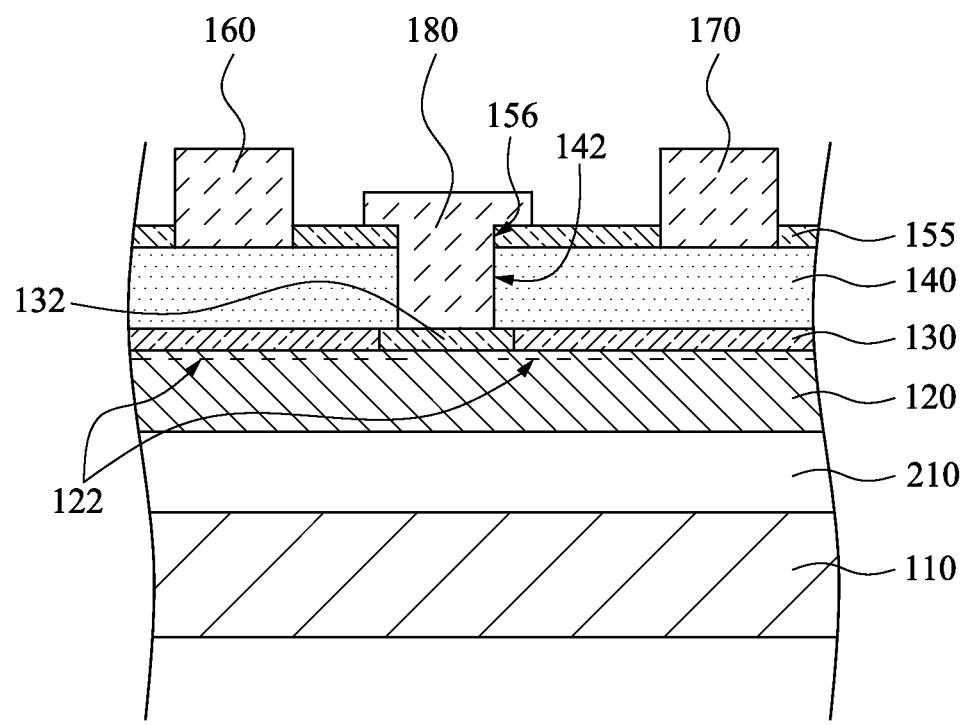

Reference is made to FIG. 4D. A gate electrode 180 is formed in the first recess 156 and the second recess 142 and on the oxidized cap layer 155. For example, a conductive layer can be formed to fill the first recess 156 and the second recess 142 and cover the oxidized cap layer 155. Subsequently, the conductive layer is patterned to form the gate electrode 180. The gate electrode 180 can be made of titanium (Ti), aluminum (Al), nickel (Ni), gold (Au), or any combination thereof. The conductive layer can be performed by physical vapor deposition process such as sputtering or e-beam evaporation process.

From a structural point of view, the difference between the fourth embodiment and the first embodiment pertains to the configuration of the source electrode 160, the drain electrode 170, the gate electrode 180, the first recess 156, and the second recess 142. The source electrode 160 and the drain electrode 170 are both disposed on the barrier layer 140. The oxidized cap layer 155 has the first recess 156, and the barrier layer 140 has the second recess 142. The spacer layer 130 has the oxidation segment 132. The first recess 156 and the second recess 142 together expose at least a portion of the oxidation segment 132. The gate electrode 180 is disposed at least on the oxidized cap layer 155, in the first recess 156 and the second recess 142, and between the source electrode 160 and the drain electrode 170.

A two-dimensional electron gas (2DEG) channel 122 exists in the channel layer 120 and near the spacer layer 130. The 2DEG channel 122 is interrupted under the first recess 156 and the second recess 142. That is, the semiconductor device of this embodiment is an enhancement-mode transistor. Other relevant structural details of the fourth embodiment are all the same as the first embodiment, and, therefore, a description in this regard will not be repeated hereinafter.

Figure 5A:
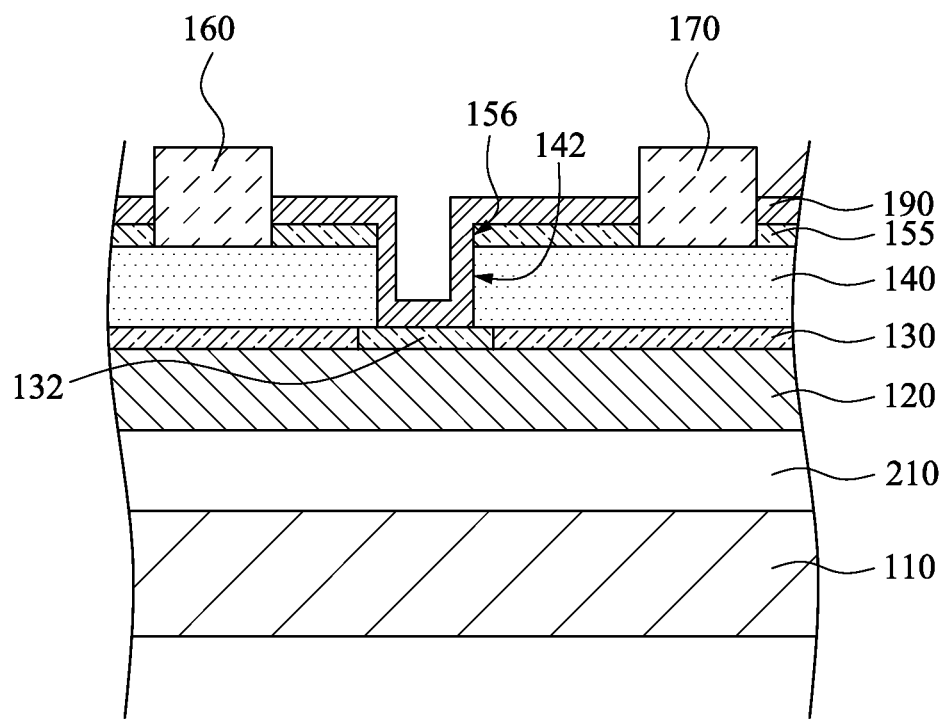
FIG. 5A to FIG. 5B are cross-sectional views of a method for manufacturing a semiconductor device at different stages according to the fifth embodiment of the present invention.
Figure 5B:
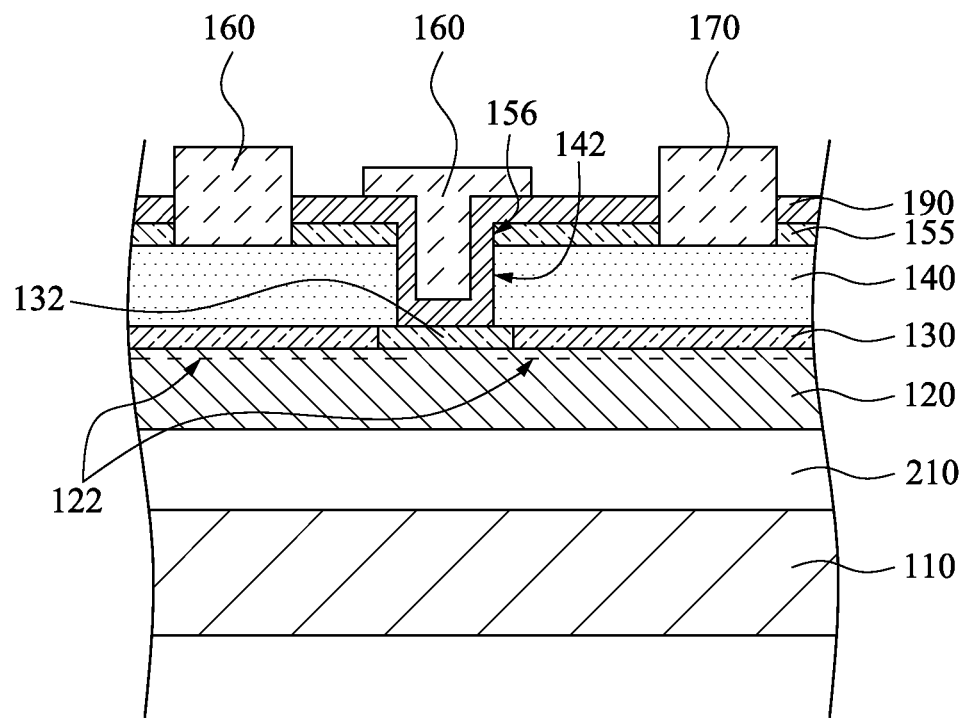

FIG. 5A to FIG. 5B are cross-sectional views of a method for manufacturing a semiconductor device at different stages according to the fifth embodiment of the present invention. The difference between the fifth embodiment and the fourth embodiment pertains to the configuration of a passivation layer 190. Reference is made to FIG. 5A. The manufacturing processes of FIG. 1A to FIG. 1D, and FIG. 4A to FIG. 4C are performed first. Since the relevant manufacturing details are all the same as the fourth embodiment, and, therefore, a description in this regard will not be repeated hereinafter. Subsequently, the passivation layer 190 is conformally formed in the first recess 156 and the second recess 142. In this embodiment, the passivation layer 190 can be made of aluminum oxide ($Al_2O_3$), aluminum nitride (AlN), silicon nitride ($Si_3N_4$), silicon oxide ($SiO_2$), Hafnium oxide ($HfO_2$), or any combination thereof. The passivation layer 190 can be performed by chemical vapor deposition process.

Reference is made to FIG. 5B. A gate electrode 180 is formed above the oxidized cap layer 155, on the passivation layer 190, and in the first recess 156 and the second recess 142. For example, a conductive layer can be formed to cover at least the passivation layer 190. Subsequently, the conductive layer is patterned to form the gate electrode 180. The gate electrode 180 can be made of titanium (Ti), aluminum (Al), nickel (Ni), gold (Au), or any combination thereof. The conductive layer can be performed by physical vapor deposition process such as sputtering, or e-beam evaporation process.

From a structural point of view, the difference between the fifth embodiment and the fourth embodiment pertains to the configuration of the passivation layer 190. In this embodiment, the passivation layer 190 is conformally disposed in the first recess 156 and the second recess 142, and at least a portion of the passivation layer 190 is disposed between the gate electrode 180 and the oxidation segment 132 of the spacer layer 130. The passivation layer 190 protects the underlying layers. Other relevant structural details of the fifth embodiment are all the same as the fourth embodiment, and, therefore, a description in this regard will not be repeated hereinafter.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:
   a substrate;
   a channel layer disposed on or above the substrate, wherein a two dimensional electron gas channel exists in the channel layer;
   a spacer layer disposed on the channel layer and in contact with the channel layer;
   a barrier layer disposed on the spacer layer and in contact with the spacer layer;
   an oxidized cap layer disposed on the barrier layer and in contact with the barrier layer, wherein the oxidized cap layer is made of aluminum oxynitride;
   a source and a drain disposed on or above the barrier layer;
   a gate disposed at least on or above the oxidized cap layer and disposed between the source and the drain, wherein the spacer layer has an oxidation segment, the oxidized cap layer has a first recess, and the barrier layer has a second recess, the first recess and the second recess together expose at least a portion of the oxidation segment, and at least a portion of the gate is disposed in the first recess and the second recess; and
   a passivation layer disposed on the oxidized cap layer, wherein at least a portion of the passivation layer is disposed between the oxidized cap layer and the gate, and at least a portion of the passivation layer is in contact with the barrier layer.

2. The semiconductor device of claim 1, wherein a thickness of the spacer layer is less than 5 nm.

3. The semiconductor device of claim 1, wherein the spacer layer is made of aluminum nitride.

4. The semiconductor device of claim 1, wherein a thickness of the oxidized cap layer is less than 5 nm.

5. The semiconductor device of claim 1, wherein the barrier layer is made of aluminum gallium nitride ($Al_xGa_{(1-x)}N$), and $0.1 \leq x \leq 0.4$.

6. The semiconductor device of claim 1, wherein the passivation layer is conformally disposed in the first recess and the second recess, and at least a portion of the passivation layer is disposed between the gate electrode and the oxidation segment of the spacer layer.

* * * * *